United States Patent [19]
Slemmer et al.

[11] Patent Number: 5,365,129
[45] Date of Patent: Nov. 15, 1994

[54] TEMPERATURE-COMPENSATED VOLTAGE LEVEL SENSE CIRCUIT

[75] Inventors: William C. Slemmer, Dallas; Bruce A. Doyle, Richardson, both of Tex.

[73] Assignee: SGS-Thomson Microelectronics, Inc., Carrollton, Tex.

[21] Appl. No.: 55,080

[22] Filed: Apr. 29, 1993

[51] Int. Cl.⁵ ............................................. H03K 5/24
[52] U.S. Cl. .................................... 327/65; 327/91; 327/94; 327/77
[58] Field of Search ............... 302/491, 494, 355, 246, 302/353; 328/151, 127

[56] References Cited

U.S. PATENT DOCUMENTS

| | | | |
|---|---|---|---|
| 4,024,414 | 5/1972 | Gurry | 328/151 |
| 4,845,382 | 7/1989 | Eouzan et al. | 302/353 |
| 4,905,056 | 2/1990 | Berndt et al. | 357/4 |
| 5,206,543 | 4/1993 | Takita et al. | 302/353 |

FOREIGN PATENT DOCUMENTS

0186186  9/1985  Japan ................................. 302/353

OTHER PUBLICATIONS

Gray et al., Analysis and Design of Analog Integrated Circuits, Second Edition, (1977, 1984) pp. 289–296.

*Primary Examiner*—Timothy P. Callahan
*Assistant Examiner*—Dinh Le
*Attorney, Agent, or Firm*—Rodney M. Anderson; Lisa K. Jorgenson; Richard K. Robinson

[57] ABSTRACT

A voltage level sense circuit that has temperature compensation is disclosed. The circuit includes charge-sharing capacitors in each of an input leg and a reference leg. The charge-sharing capacitors are precharged to voltages that are integral multiples of the forward bias voltage drop across the base-emitter junction of a bipolar transistor. The bipolar transistors in the input leg differ from those in the reference leg, so that the difference in base-emitter on voltages increases with temperature. The increasing difference in base-emitter on voltage compensates for the decrease in the absolute value of the base-emitter on voltage with temperature. Voltage level sensing is accomplished by sampling the input voltage with a capacitor, charge-sharing the sampled voltage with one of the precharged charge-sharing capacitors, and coupling the charge-shared result to an input of a differential amplifier comparator. The second charge-sharing capacitor, after sharing its charge with another capacitor inserted for purposes of circuit matching, is coupled to the other input of the differential amplifier, and the comparison is performed.

18 Claims, 3 Drawing Sheets

TEMPERATURE-COMPENSATED VOLTAGE LEVEL SENSE CIRCUIT

This invention is in the field of integrated circuits, and is more specifically directed to voltage level sense circuits.

BACKGROUND OF THE INVENTION

The performance of many modern electronic systems depends, to a large degree, upon the stable operation of solid-state integrated circuits in the system over a range of operating conditions. A stability factor with which many in the art are concerned is temperature stability, particularly the temperature stability of circuit response to input signals. More specifically, it is highly desirable that digital integrated circuits have stable switching characteristics over the expected temperature range, particularly in having a constant trip point voltage over temperature.

The integration of a large number of circuit elements onto a single integrated circuit "chip" has greatly improved circuit performance, due to the matching of device parameters obtained as a result of the simultaneous manufacture of the circuit elements on the same chip. Such matching reduces the sensitivity of the circuit to shifting in manufacturing parameters, as parameter variations will tend to similarly affect circuit elements on the same chip. However, sensitivity of circuit performance to manufacturing variability still exists, especially in sensitive circuits such as those used to sense whether an input signal is above or below a selected trip voltage.

By way of background, one type of conventional circuit for providing a stable reference voltage relative to an input voltage is the so-called Widlar band-gap reference circuit, an example of which is described in Gray, et al., *Analysis and Design of Analog Integrated Circuits* (John Wiley & Sons, 1977, 1984), at pp. 289–296. This circuit produces an output voltage that is equal to the $Vbe_{(on)}$ of a bipolar transistor plus a voltage proportional to the difference between the forward bias voltage drop across the base-emitter junction of two transistors, and thus generates a relatively stable reference voltage over temperature. Gray et al. also disclose an improved band-gap reference circuit having reduced sensitivity to power supply variations relative to the traditional Widlar circuit. These band-gap circuits are generally used to provide a temperature-insensitive reference voltage, for example as an input to a voltage regulator circuit.

It is an object of the present invention to provide a voltage level sense circuit in which the trip voltage remains stable over a temperature range.

It is a further object of the present invention to provide such a circuit in which the trip voltage is stable over process variations.

It is a further object of the present invention to provide such a circuit which may be implemented in CMOS-compatible technology.

Other objects and advantages of the present invention will be apparent to those of ordinary skill in the art having reference to the following specification together with the drawings.

SUMMARY OF THE INVENTION

The invention may be incorporated into a voltage level sense circuit that utilizes charge sharing among switched capacitors to produce inputs to a differential comparator. The circuit includes an input leg and a reference leg, each of which have a capacitor precharged to a voltage determined by the forward bias base-emitter voltage drop of one or more bipolar transistors. The bipolar transistors in one leg have different emitter current densities compared to those in the other leg, resulting in a voltage differential that varies with temperature. The negative temperature coefficient of base-emitter voltage drop is compensated for by the positive temperature coefficient of the voltage differential. Accordingly, the charge-sharing voltage is stable over the temperature range, which in turn maintains stability in the trip voltage of the circuit.

DETAILED DESCRIPTION OF THE PREFERRED EMBODIMENT

Figure 1:
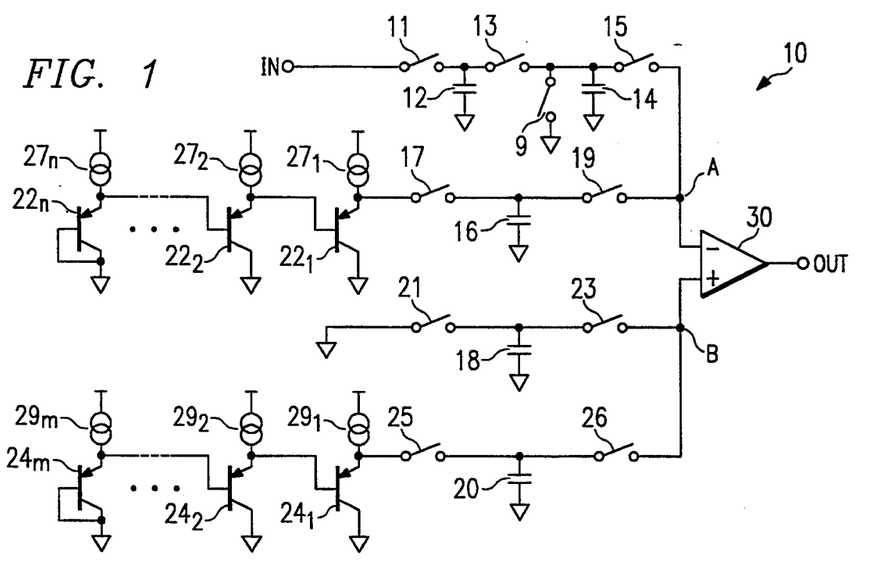
FIG. 1 is a schematic diagram, in electrical form, of a voltage level sense circuit according to the present invention.

Referring first to FIG. 1, voltage level sense circuit 10 according to the preferred embodiment of the invention will now be described. Circuit 10 is for comparing the voltage $V_{in}$ at terminal IN against a trip voltage, and for presenting a voltage $V_{out}$ at terminal OUT according to the results of this comparison. As such, in this embodiment of the invention, circuit 10 includes comparator 30 having a positive and a negative input, and which is a conventional differential amplifier or other known circuit for performing the voltage comparison function. Circuit 10 includes an input leg connected to the negative input of comparator 30 at node A and a reference leg connected to the positive input of comparator 30 at node B. Of course, the input and reference legs may be interchanged at the inputs to comparator 30, depending upon the output voltage polarity desired.

In the input leg of circuit 10, switch 11 is connected between terminal IN and a first plate of capacitor 12, the second plate of which is biased to a reference voltage, such as ground in this example. Switch 13 is connected between the first plate of capacitor 12 and the first plate of capacitor 14 (which has its second plate biased to ground), and switch 15 is connected between the first plate of capacitor 14 and node A, at the negative input of comparator 30. Switch 9 is connected in parallel with capacitor 14, for discharging capacitor 14 between operations to remove any residual charge. Also in the input leg of circuit 10 is a series of p-n-p bipolar transistors $22_1$ through $22_n$ connected in emitter follower fashion with one another, with the first transistor $22_1$ in the series having its emitter connected to one side of switch 17, and with the emitter of the last transistor $22_n$ in the series having its base connected to its collector and biased to ground. Each of transistors 22 have their collectors biased to ground, and their emitter currents supplied by a corresponding current source 27. Switch 17 is connected between the emitter of the first transistor $22_1$ and a first plate of capacitor 16, and switch 19 is connected between the first plate of capacitor 16 and node A. The second plate of capacitor 16 is biased to ground.

The reference leg of circuit 10 is similarly configured as the input leg. Switch 21 is connected between ground and the first plate of capacitor 18, and switch 23 is connected between the first plate of capacitor 18 and node B at the positive input of comparator 30; the second plate of capacitor 18 is biased to ground. Also in the reference leg of circuit 10, p-n-p transistors $24_1$ through $24_m$ are connected in emitter follower fashion, with the base of the last transistor $24_m$ connected to its collector and biased to ground; the collector of each of transistors 24 is biased to ground, and the emitter current for each of transistors 24 is provided by a corresponding current source 29. Switch 25 is connected between the emitter of first transistor $24_1$ and the first plate of capacitor 20, which has its other plate biased to ground. Switch 26 is connected between the first plate of capacitor 20 and node B.

The portion of the reference leg of circuit 10 including capacitor 18 and switch 21 is provided in this embodiment of the invention to form a matching network with the input leg of circuit 10. This matching of the construction of the input and reference legs of circuit 10 provides compensation for offsets due to process variations and due to the interaction of the switches on the charge sharing operation described below.

Timing and control circuitry (not shown) is of course provided in the integrated circuit including circuit 10, to control the operation of switches 11, 15, 16, 17, 21, 23, 25, 26 in the appropriate manner, as will be described hereinbelow.

In operation, as is apparent from FIG. 1, circuit 10 operates as a switched capacitor network to perform the voltage level sense function. Capacitors 16, 18 and 20 are precharged to known voltages by the closing of switches 17, 21, 25 while switches 19, 23, 26 remain open. In this precharge operation, capacitor 16 charges to the voltage $nVbe_{22}$, where $Vbe_{22}$ is the forward bias voltage drop across the base-emitter junction of one of transistors 22, all of transistors 22 being similarly fabricated, and where n is the number of transistors 22 in the series. Similarly, capacitor 20 precharges to the voltage $mVbe_{24}$, where $Vbe_{24}$ is the forward bias voltage drop across the base-emitter junction of one of transistors 24, and where m is the number of transistors 24 in the series. Capacitor 18 is precharged to ground during the precharge period of circuit 10.

The input voltage $V_{in}$ at terminal IN is sampled by switch 11 closing with switch 13 remaining open, such that the voltage at terminal $V_{in}$ is stored across capacitor 12; at this same time, switch 9 is closed, with switch 15 remaining open, to precharge capacitor 14 to ground. After this sampling, switches 9 and 11 open and switch 13 closes so that the charge stored on capacitor 12 is shared onto capacitor 14, after which switch 13 opens again. This charge sharing operation allows for the sampling of the input voltage $V_{in}$ in a buffered fashion relative to the remainder of circuit 10.

The comparison function is obtained by switches 15, 19, 23, 26 which, when closed, combine the charge of capacitors 14 and 16 with one another at node A, and combine the charge of capacitors 18 and 20 with one another at node B. The differential voltage presented to the inputs of comparator 30 is thus indicative of the voltage $V_{in}$, such that if the voltage at node A is higher than that at node B, the input voltage $V_{in}$ is above the trip point of circuit 10. Conversely, if the voltage at node B is higher than that at node A, the input voltage $V_{in}$ is below the trip point of circuit 10.

The number of transistors 22, 24 in series and the sizes of capacitors 12, 14, 16, 18, 20 are selected to provide the desired trip point for circuit 10 and to effect temperature stability. The theory and method for selecting these parameters will now be described in detail.

As noted above, capacitor 16 is precharged to a voltage $nVbe_{22}$, which is the sum of the forward bias base-emitter voltage drops in the emitter follower series of n transistors 22; similarly, capacitor 20 is precharged to the voltage $mVbe_{24}$, which is the sum of the forward bias base-emitter voltage drops in the emitter follower series of m transistors 24. According to the preferred embodiment of the invention, temperature compensation is provided in circuit 10 by selecting the voltage $Vbe_{22}$ to be different from the voltage $Vbe_{24}$, and to have a different temperature coefficient. These differences are implemented, in this example, by choosing differently sized base-emitter junctions for transistors 22 relative to transistors 24. In this embodiment of the invention, the emitter regions of transistors 22 are significantly larger than those of transistors 24; for example, the respective emitter regions may differ by a factor of on the order of twenty.

Figures 2, 3:
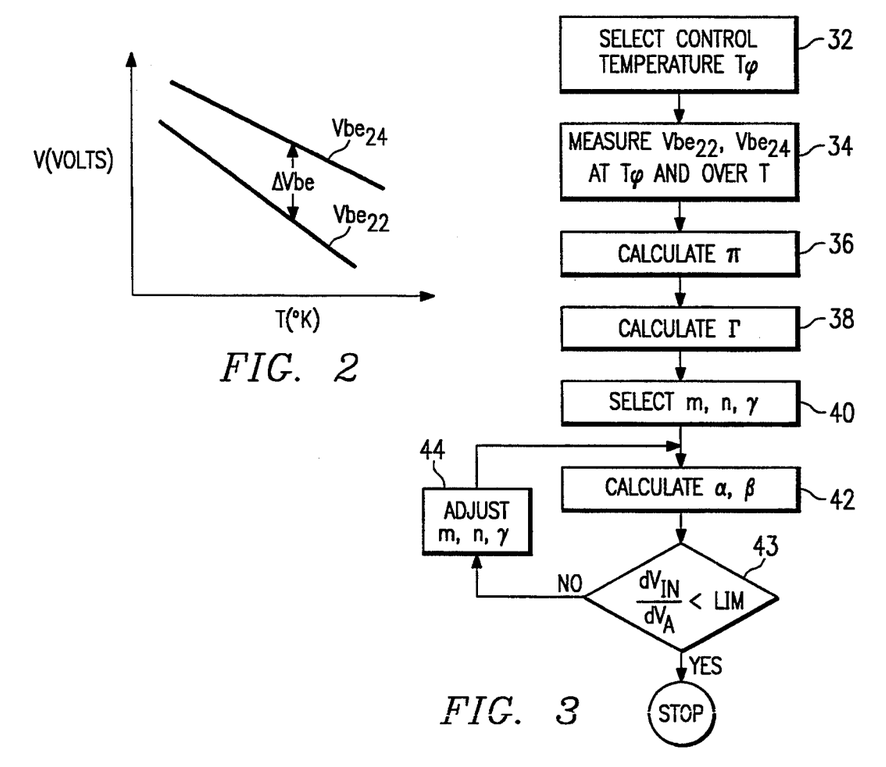
FIG. 2 is a plot of the temperature dependence of the forward bias voltage drop across the base-emitter junction for transistors having different emitter sizes.
FIG. 3 is a flow diagram illustrating a method of selecting circuit parameters for the circuit of FIG. 1.

Referring to FIG. 2, the temperature dependence of the voltages $Vbe_{22}$ and $Vbe_{24}$ will now be described qualitatively. As illustrated in FIG. 2, the larger base-emitter junction in transistor 22 relative to transistor 24 results in a lower Vbe value for transistor 22. More importantly though, for purposes of the present invention, voltage $Vbe_{22}$ decreases with increasing temperature at a faster rate than does the voltage $Vbe_{24}$. The difference between the voltages $Vbe_{24}$ and $Vbe_{22}$ will be referred to as $\Delta Vbe$, and has a positive temperature coefficient. The temperature coefficient of $\Delta Vbe$ is useful, according to the present invention, in effecting the temperature compensation of circuit 10.

The design criteria for voltage level sense circuit 10 can be expressed as follows:

$$V_{inT} \text{ produces } V_A = V_B \text{ over the temperature range} \quad (1)$$

where $V_{inT}$ is the desired trip voltage, and where $V_A$ and $V_B$ are the voltages at nodes A and B, respectively, and $$V_{inT} = \Gamma(Vbe_{24} + \pi \Delta Vbe) \quad (2)$$

where $\Gamma$ and $\pi$ are factors to be determined according to the procedure described hereinbelow. As is apparent from FIG. 2, the temperature coefficient of $Vbe_{24}$ is negative while the temperature coefficient of $\Delta Vbe$ is positive. According to the present invention as expressed in equation (2), these offsetting temperature coefficients can be used to provide a stable trip voltage $V_{inT}$.

For purposes of further definition, the capacitance values in circuit 10 can be defined relative to selected values $C_{in}$ and $C_{ref}$, where the value $C_{in}$ is the capacitance of the input leg and where $C_{ref}$ is the capacitance of the reference leg. For ease of analysis, in the following example $C_{in}$ will be equal to $C_{ref}$, and will be expressed merely as the value C. The capacitance values of individual capacitors will be expressed herein by way of subscripts. For example, the capacitance value of capacitor 12 will be expressed as $C_{12}$.

Referring back to FIG. 1, it will be useful to define the capacitances of the individual capacitors relative to the capacitance value C. As such, capacitance $C_{20}$ will be defined as $\alpha C$, defining capacitance $C_{18}$ as $(1-\alpha)C$, where $\alpha$ is the fraction of the voltage at the emitter of transistor $24_1$ that is to appear at node A. The value $\alpha$ may thus vary from 0 to 1, and includes the special case of $\alpha=1$ in which capacitor 18 and switches 21, 23 would be eliminated. It is preferred, however, to maintain the value $\alpha$ less than one in order to obtain the benefits of the matching network of capacitor 18, such benefits including process stability as discussed above.

Furthermore, in the case where capacitor 18 is an MOS capacitor, it may be preferable to precharge capacitor 18 to a voltage that is within the linear region of its capacitance-voltage characteristic; this voltage may be selected to be that at the emitter node of one of transistors 24. In such an implementation, the value $\alpha$ would be selected in such a manner to ensure that the fraction of the voltage at the emitter of transistor $24_1$ that is to appear at node A is consistent with the bias voltage applied to capacitor 18; it is contemplated that selection of the value $\alpha$ would readily be made by one of ordinary skill in the art, given this description.

Capacitance $C_{16}$ is similarly defined as $\beta C$, which defines capacitance $C_{14}$ as the value $(1-\beta)C$. The buffered charge sharing between capacitors 12 and 14 defines capacitance $C_{12}$ as the quantity $\gamma(1-\beta)C/(1-\gamma)$. The coefficient $\gamma$ may also be set at one, in the extreme, in which case capacitor 12 and switches 9, 13 would be eliminated, and the voltage $V_{inT}$ would be applied directly to capacitor 14. A $\gamma$ value of less than one is preferred, however, in order to obtain the benefits of a buffered input. The factors $\alpha$, $\beta$, and $\gamma$ will be selected in the manner described hereinbelow to establish the desired trip voltage for circuit 10.

Given the above definitions of the individual capacitance values relative to capacitance C, the voltage $V_A$ and $V_B$ at the end of a sampling period may be determined as follows:

$$V_A = (1-\beta)\gamma V_{inT} + \beta n V be_{22} \qquad (3)$$

$$V_B = \alpha m V be_{24} \qquad (4)$$

Given relationship (1), in which $V_A = V_B$ over the temperature range, setting equation (3) equal to equation (4) results in the following:

$$(1-\beta)\gamma V_{inT} + \beta n V be_{22} = \alpha m V be_{24} \qquad (5)$$

As defined above, $\Delta Vbe = Vbe_{24} - Vbe_{22}$, and the definition:

$$\Delta Vbe = (kT/q)\ln(J24/J22) \qquad (6)$$

where J24 and J22 correspond to the emitter current densities of transistors 24 and 22, respectively. In the preferred embodiment of the invention, referring back to FIG. 1, the current provided by each current source 27 is the same as that provided by each current source 29, meaning that the current density ratio J24/J22 will correspond to the inverse ratio of the effective emitter sizes of transistors 24 relative to transistors 22. Considering current crowding and other effects that cause non-uniform conduction over the emitter area of a transistor, it is preferable to implement this emitter size ratio by fabricating the bipolar transistors as structures of identical geometries, but where each of transistors 22 in FIG. 1 is implemented as multiple transistor structures in parallel. According to this example, if the current density ratio J24/J22 is to be twenty, each transistor 22 of FIG. 1 will correspond to twenty identical transistor structures (of the same geometry as one of transistors 24) connected in parallel.

Given equation (4), equation (5) can be rewritten as follows:

$$(1-\beta)\gamma V_{inT} + \beta n V be_{24} - \beta n(kT/q)\ln(J24/J22) = \alpha m V be_{24} \qquad (7)$$

The trip voltage $V_{inT}$ can now be expressed relative to the circuit parameters as follows:

$$V_{inT} = [Vbe_{24}(\alpha m - \beta n) + \beta n(kT/q)\ln(J24/J22)]/(1-\beta)\gamma \qquad (8)$$

Equation (8) may now be used in connection with the second design criteria, namely equation (2), to establish the multiplicative factors $\Gamma$, $\pi$. Using equation (8) and equation (2) yields:

$$(1-\beta)\gamma\Gamma(Vbe_{24} + \pi(kT/q)\ln(J24/J22)) = (\alpha m - \beta n)Vbe_{24} + \beta n(kT/q)\ln(J24/J22) \qquad (9)$$

from which the following can be determined using the principle of detailed balance:

$$(1-\beta)\gamma\Gamma = \alpha m - \beta n \qquad (10)$$

and $$(1-\beta)\gamma\Gamma\pi = \beta n \qquad (11)$$

Solving for $\beta$ and $\alpha$ yield the following:

$$\beta = \Gamma\pi\gamma/(n + \Gamma\pi\gamma) \qquad (12)$$

and $$\alpha = (\beta n(1+\pi))/\pi m \qquad (13)$$

As a result of equations (12) and (13), the factors $\alpha$, $\beta$ may be used to determine the size of capacitors 12, 14, 16, 18, 20 for given values of the parameters $\gamma$ (ranging from 0 to 1), $\Gamma$ and $\pi$. Determination of the factor $\pi$ requires consideration that the trip voltage $V_{inT}$ is to be independent of temperature, and thus so that the temperature derivative of equation (2) is zero. Expressing equation (2) using equation (6) provides:

$$V_{inT} = \Gamma(Vbe_{24} + \pi(kT/q)\ln(J24/J22)) \qquad (14)$$

Differentiation of equation (14) with respect to temperature T provides, for temperature independence:

$$\partial V_{inT}/\partial t = 0 = \Gamma[(\partial Vbe_{24}/\partial T) + \pi(k/q)\ln(J24/J22)] \qquad (15)$$

Solving equation (15) for $\pi$, and eliminating $\Gamma$, yields:

$$\Pi = \frac{q}{k\ln\left(\frac{J24}{J22}\right)} \left| \frac{\partial Vbe_{24}}{\partial T} \right|_{T=T_0} \quad (16)$$

where $T_O$ is a selected control temperature, preferably near the midpoint of the desired temperature range. Upon solving for $\pi$, factor $\Gamma$ may be readily determined from the following equation, derived from equation (2):

$$\Gamma = \frac{V_{inT}}{V_{be24}(T_0) + \Pi\left(\frac{kT_0}{q}\right)\ln\left(\frac{J24}{J22}\right)} \quad (17)$$

Figure 6:
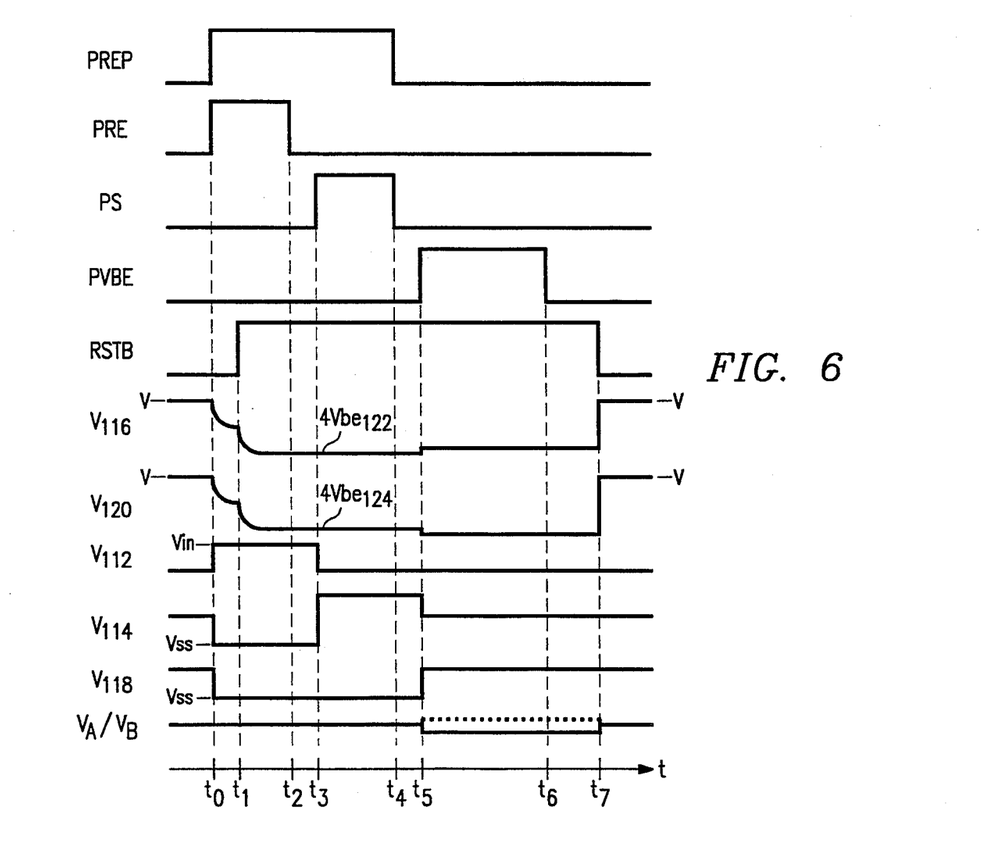
FIG. 6 is a timing diagram illustrating the operation of the circuit of FIG. 4.

According to the preferred embodiment of the invention, and considering that a universe of solutions for the set of parameters m, n, $\gamma$ exist, it is preferred to maximize the noise margin at the negative input of comparator 30 at node A. This is accomplished by minimizing the derivative $\partial V_{in}/\partial V_A$, which will in turn minimize the sensitivity of the input trip point to noise at the input. Referring now to FIG. 6, a method for determining these parameters will now be described in detail.

In process 32, a control temperature $T_0$ is selected. Temperature $T_0$ is preferably in the center of the desired temperature range over which the trip voltage $V_{inT}$ is to be stable, as such selection will tend to minimize the magnitude of the largest temperature deviation from the nominal condition. After selection of control temperature $T_0$, the forward bias voltage drop $Vbe_{24}$ is measured, in process 34, at control temperature $T_0$ for representative transistors having the emitter sizes and bias current to be used and fabricated according to the process technology, as well as the current source configuration. Alternatively, a simulation program such as SPICE may be used to determine these forward bias voltage drops. The variation of the forward bias voltage drop $Vbe_{24}$ over the temperature range is also measured in a similar fashion, in process 34, to determine a value of $\partial Vbe_{24}$. Alternatively, the value $\partial Vbe_{24}$ may be determined by way of device simulation.

Once the value $\partial Vbe_{24}$ is determined, process 36 is performed by way of which the value $\pi$ is calculated, using equation (16) noted above. This value of $\pi$ may then be used, in process 38, to calculate the value $\Gamma$ using equation (17).

The optimization of the values m, n, $\gamma$ can then be performed. As noted above, it is preferable to maximize the sensitivity of the voltage $V_A$ to the input voltage $V_{in}$. This optimization begins with process 40 in which initial values of m, n and $\gamma$ are selected. As is evident from the circuit of FIG. 1, the values m, n are integers and the value $\gamma$ is a real number between 0 and 1. Using the initial values of m, n, $\gamma$ determined in process 40, the values of $\alpha$ and $\beta$ are calculated using equations (12) and (13).

Upon calculation of the value $\beta$, the noise immunity at node A can be determined in decision 43 using, from equation (8):

$$\partial V_{in} \partial V_A = 1/[(1-\beta)\gamma] \quad (18)$$

If the noise immunity is not below the desired limit, process 44 is performed, by way of which one or more of the factors m, n, $\gamma$ are adjusted, followed by recalculation of the factors $\alpha$, $\beta$ in process 42. At such time as the noise immunity is adequate (i.e., the result of decision 43 is yes), the process is completed.

As a result of the process of FIG. 3, the number n of transistors 22, the number m of transistors 44, and the relationships among capacitors 12, 14, 16, in the input leg, and among capacitors 18, 20 in the reference leg, are determined. While the differential comparison performed by comparator 30 does not depend upon the base capacitance value C, the value C is preferably selected so that the response of circuit 10 meets the desired performance specifications.

Figure 4:
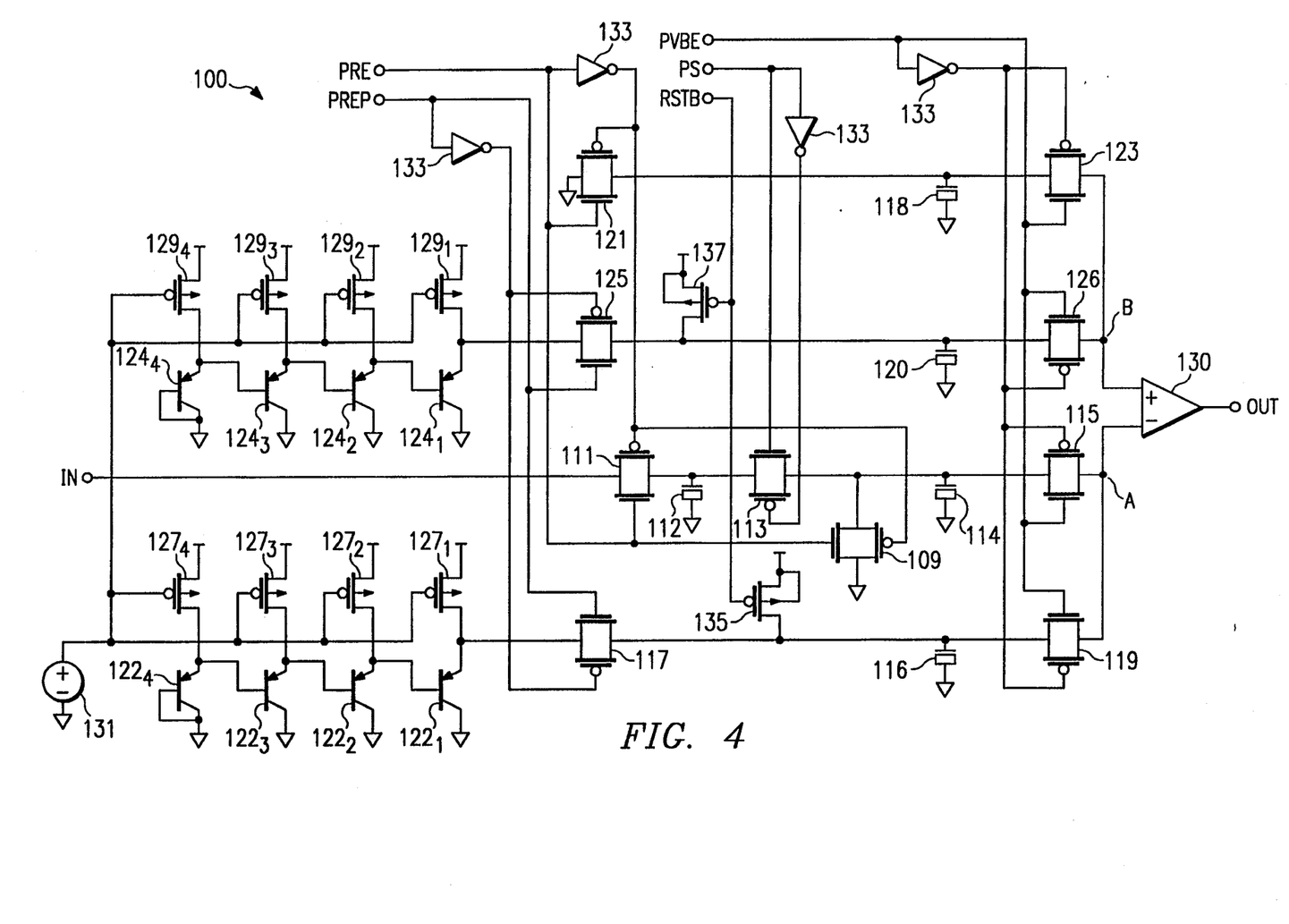
FIG. 4 is a schematic diagram, in electrical form, of an implementation of the preferred embodiment of the invention in a CMOS circuit.

Referring now to FIG. 4, circuit 100 according to the present invention and configured according to a specific CMOS implementation of circuit 10 will now be described in detail. For clarity of explanation, it should be noted that the position of the input and reference legs of circuit 100 are reversed in the schematic diagram of FIG. 4 from that discussed above relative to circuit 10 of FIG. 1.

In this example, circuit 100 includes four of each of p-n-p bipolar transistors 122, 124, upon which is based the temperature compensation based upon the temperature characteristics of forward bias base-emitter junction voltages discussed hereinabove. Circuit 100 is of the n-well CMOS type, and as such each of p-n-p transistors 122 and 124 are formed as vertical bipolar transistors fabricated according to a conventional CMOS process. According to the present invention, such vertical bipolar transistors are adequate for use in circuit 100, as transistors 122, 124 are not required to perform rapid switching or otherwise are to have high forward gain or other high performance small-signal characteristics. As noted above, the sole purpose of transistors 122, 124 is to provide forward bias base-emitter voltages Vbe122, Vbe124 that differ from one another by an amount that varies with temperature.

Of course, it is contemplated that the circuit of FIG. 4 may be alternatively be implemented where transistors 122, 124 are n-p-n type, particularly if fabricated according to p-well CMOS technology. It is contemplated that such a complementary and equivalent implementation is within the scope of the invention described and claimed herein.

Figure 5:
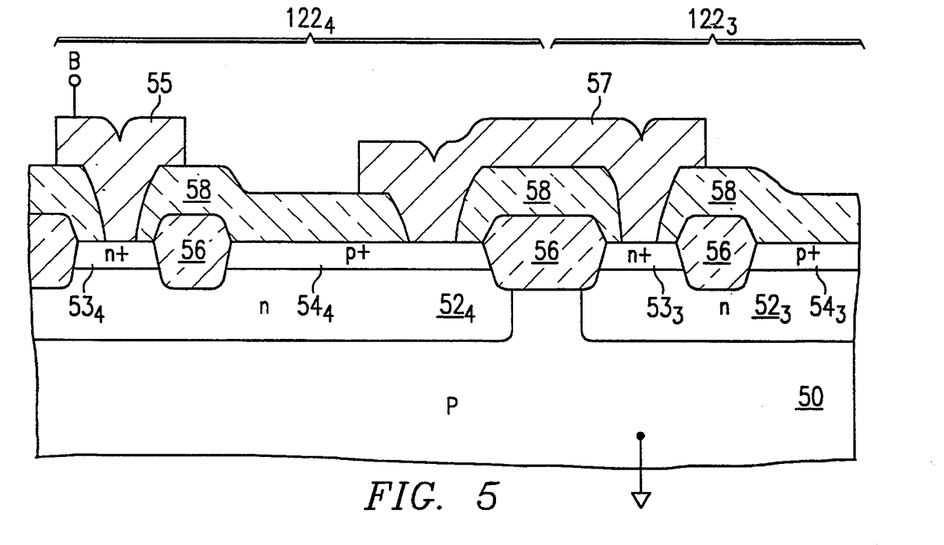
FIG. 5 is a cross-sectional diagram of a portion of an integrated circuit embodying the circuit of FIG. 4, illustrating the construction of bipolar transistors therein.

Referring now to FIG. 5, an example vertical p-n-p transistors $122_4$, $122_3$, both fabricated according to a conventional n-well CMOS process, will now be described in detail. Transistor $122_4$ has a collector formed by p-type substrate 50 which is biased to ground; alternatively, an epitaxial layer over a substrate could serve as the collector. N-well $52_4$ serves as the base of vertical transistor $122_4$, with heavily doped region $53_4$ used to provide good ohmic contact between base electrode 55 and n-well $52_4$, as is well known in the art. P-type diffusion $54_4$ into n-well $52_4$ serves as the emitter, with field oxide 56 separating p-type diffusion $54_4$ from contact region $53_4$ in the conventional manner. The plan area of p-type diffusion $54_4$ determines the emitter size, and thus determines the temperature characteristic of the forward bias voltage drop across the p-n junction between p-type diffusion $54_4$ and n-well $52_4$, as discussed above.

As noted above, metal electrode 55 makes contact to the base region of n-well $52_4$ by way of contact region $53_4$. Interlevel dielectric 58 underlies metal electrode 55 at locations away from the contact, as is conventional. Referring back to FIG. 4, transistor $122_4$ has its emitter connected to the base of the next transistor $122_3$ in circuit 10. This is implemented in the example of FIG. 5 by metal electrode 57, which makes contact to p+ emitter region 54₄ and which also makes contact with n-type contact region 53₃ in adjacent transistor 122₃, similarly constructed as transistor 122₄ and having a common collector with transistors 122₄ by way of substrate 50. The base regions of the adjacent transistors 122₄, 122₃ are formed as separate n-wells 52₄, 52₃, respectively, with field oxide 56 disposed at the surface therebetween.

It is readily apparent to one of ordinary skill in the art, having reference to FIG. 5, that p-n-p bipolar transistors 122 may be formed by way of conventional CMOS processing, with no additional process steps or structures necessary to form the devices. Transistors 124 may be similarly fabricated, but will have much smaller emitter areas, as noted above. As a result of this construction, it is therefore practical to implement circuit 100 of FIG. 4 in a CMOS process, including the construction of bipolar transistors 122,124 used to provide the desired temperature compensation.

Referring back to FIG. 4, circuit 100 according to this exemplary implementation will now be described in detail. As noted above, four p-n-p bipolar transistors 122,124 are used in the input and reference legs, respectively. Each of transistors 122 receive collector current from an associated MOS transistor 127, and each of transistors 124 receive collector current from an associated MOS transistor 129. Bias voltage source 131 is connected to the gate of each of transistors 127,129, such that each transistor 127, 129 serves as an emitter current source to its associated bipolar transistors 122, 124, respectively. The switches in circuit 100 are all implemented as complementary pass gates, namely a p-channel MOS transistor having its sourcedrain path connected in parallel with an n-channel MOS transistor, with the complementary transistors receiving complementary signals at their gates; complementary signals are produced in this example by way of inverters 133. Each of the MOS capacitors 112,114,116, 118, 120 in circuit 100 have their opposing, or fixed bias, plates biased to ground, and are preferably fabricated as depletion type n-channel devices.

Because current sources 127, 129 are of substantially the same size and bias in this example, each current source 127, 129 is sourcing substantially the same current as the others. In order to provide the desired difference in emitter current density with the same current magnitudes, the effective emitter sizes of transistors 122 and 124 will therefore be different. As discussed above, in order to eliminate differences in current density due to non-uniform conduction in the physical emitter structures, it is preferred that each of transistors 122 be fabricated as multiple transistor structures (each with the same geometry as one of transistors 124) connected in parallel.

Terminal IN is connected, via pass gate 111, to capacitor 112, which in turn is connected, via pass gate 113, to capacitor 114. Pass gate 115 is connected between capacitor 114 and node A. Also in the input leg of circuit 100, the emitter of bipolar transistor 122₁, which is the first transistor in the emitter follower chain of four transistors 122, is connected via pass gate 117 to capacitor 116, which in turn is connected via pass gate 119 to node A at the inverting input of comparator 130. Pass gate 109 is connected in parallel with capacitor 114, and has its gate controlled by line PRE (true and complement), for discharging residual charge on capacitor 114 to ground.

In the reference leg of circuit 100, pass gate 121 is connected on one side to ground and on another side to capacitor 118. Capacitor 118 is connected to node B by way of pass gate 123. The emitter of transistors 124₁, which is the first bipolar transistor in the emitter follower series of four transistors 124, is connected via pass gate 125 to capacitor 120. Capacitor 120 is in turn connected, via pass gate 126, to node B at the non-inverting input of comparator 130.

Pass gates 117 and 125 each receive complementary signals from line PREP. Pass gates 121 and 111 each receive complementary signals from line PRE. Pass gate 113, between capacitor 112 and capacitor 114, receives complementary signals from line PS. Pass gates 115, 119, 123, 126 each receive complementary signals from line PVBE to effect the presentation of the differential signal to comparator 130.

A reset function is also included in circuit 100, by way of transistors 135 and 137. P-channel transistor 135 has its source-drain path connected between capacitor 116 and $V_{cc}$, and has its gate controlled by line RSTB. Similarly, p-channel transistor 137 has its source-drain path connected between capacitor 118 and $V_{cc}$, and also has its gate controlled by line RSTB. As will be described hereinbelow, line RSTB can thus reset capacitors 116, 118 prior to connection of transistors. 122, 124 thereto, to ensure rapid precharging in the manner described hereinbelow.

As a result of the method described hereinabove relative to FIG. 3, design of circuit 100 resulted in the factors set. forth in Table 1 below.

TABLE 1

| Parameter | Value |
|-----------|-------|
| m | 4 |
| n | 4 |
| α | 0.89 |
| β | 0.80 |
| γ | 0.50 |
| C | 20 pF |

Referring now to FIG. 6, the operation of circuit 100 according to this exemplary implementation will now be described in detail. Such operation is under the control of timing and control circuitry (not shown) which controls the energizing of the various control signals coupled to the pass gates in circuit 100 to effect the desired operation. It is contemplated that one of ordinary skill in the art, having reference to this description of the function of the control signals in circuit 100, will be readily able to implement such timing control circuitry according to conventional techniques.

Prior to time t₀, line RSTB is at a low logic level, turning on transistors 135, 137 which pulls the voltages $V_{116}$, $V_{120}$ at capacitors 116, 120, respectively, to $V_{cc}$. Also during this time, each of control signals PREP, PRE, PS, PVBE are low, such that all pass gates in circuit 100 are turned off. This condition, prior to time t₀ in FIG. 6, is the reset condition of circuit 100.

Precharge of circuit 100 begins at time t₀, with control signals PREP, PRE going to a high logic level, turning on pass gates 109, 121, 125, 111, 117. With pass gates 109 and 121 turned on, capacitors 114 and 118 are each discharged to ground, as indicated in FIG. 6 by their respective voltages $V_{114}$ and $V_{118}$. Capacitor 112 receives voltage $V_{in}$ at terminal IN with pass gate 111 turned on; pass gate 113 remains off at this time, however, isolating capacitor 112 from capacitor 114.

After time $t_0$, with line RSTB low and line PREP high, capacitors 116, 120 begin discharging toward the voltage levels determined by transistors 122, 124, respectively. As noted above, transistors 135, 137 ensure that capacitors 116, 120 are precharged by being discharged from $V_{cc}$, rather than by being charged from a lower voltage. This ensures that the precharging operation is performed by bipolar transistors 122, 124 rather than current source transistors 127, 129, respectively. Current source transistors 127, 129 are preferably relatively small, to ensure that the base-emitter voltages $V_{be122}$ and $V_{be124}$ are centered in the log-linear operating region of the emitter current voltage characteristic. Accordingly, current source transistors are not sufficiently powerful to rapidly precharge capacitors 116, 120 in this embodiment of the invention. Devices 135, 137 are held on during this initial precharge interval to maintain an increased emitter current level in transistors 122, 124. This reduces the equivalent source impedance of transistors $122_1$, $124_1$ so that the voltage at capacitors 116, 120, respectively, may settle rapidly. Alternatively, this precharge control may be effected by briefly controlling bias voltage source 131 to turn on current sources 127, 129 more strongly, thus increasing the emitter currents and reducing the source resistance of transistors $122_1$, $124_1$.

At time $t_1$, line RSTB returns to a high logic level, turning off transistors 135, 137, allowing capacitor 116 to precharge to the voltage $4Vbe_{122}$, and allowing capacitor 120 to precharge to the voltage $4Vbe_{124}$.

At time $t_2$, line PRE returns to a low logic level, turning off pass gates 109, 121 and 111. By this time, voltage $V_{114}$ of capacitor 114 and voltage $V_{118}$ at capacitor 118 have discharged to ground. The voltage $V_{in}$ at capacitor 112 is thus isolated, after time $t_2$, both from capacitor 114 and also from terminal IN. As a result, the input voltage $V_{in}$ is sampled by pass gate 111, with the sampled input voltage buffered from subsequent stages of circuit 100 by pass gate 113. At time $t_3$, control signal PS goes to an active high state, turning on pass gate 113, and allowing the stored charge at capacitor 112 to be charge-shared with capacitor 114. The voltage $V_{114}$ at capacitor 114 is thus charged to a voltage dependent upon the input voltage $V_{in}$, and the voltage $V_{112}$ at capacitor 112 drops slightly, to the same voltage as $V_{114}$, as a result.

At time $t_4$, lines PS and PREP both turn off, turning off pass gates 113, 117, 125. The voltages at each of the four capacitors 114, 116, 118, 120 are thus precharged and isolated from their inputs and precharging circuits, as the case may be. Charge sharing between capacitors 114, 116 in the input leg and at node A, and between capacitors 118, 120 in the reference leg and at node B, is then effected at time $t_5$ by line PVBE turning on pass gates 115, 119, 123, 126. The resulting differential voltage at nodes A and B relative to one another is then presented to comparator 130, which will produce an output signal at terminal OUT (not shown in FIG. 6).

After sufficient time for comparator 130 to respond to the differential voltage at its inputs, circuit 100 prepares for the next sample. At time $t_6$, line PVBE returns to an inactive state, turning off pass gates 115, 119, 123, 126 and isolating nodes A and B from their respective input and reference legs. At time $t_7$, line RSTB returns to a low logic level, turning on transistors 135, 137, and again setting voltages $V_{116}$, $V_{118}$ to $V_{cc}$ so that bipolar transistors 122, 124 may discharge them in the precharge operation in the next cycle. Circuit 100 is then ready for the next sampling of voltage at terminal IN.

As discussed above, circuit 110 according to this exemplary implementation of this preferred embodiment of the invention provides many advantages. The trip voltage of circuit 100 is quite stable over temperature, due to the compensating effects of the differently sized bipolar transistors 122, 124. Furthermore, such temperature stability is obtained by using bipolar transistors fabricated in a manner compatible with CMOS processing. In addition, bipolar transistors 122, 124 are used to advantage to quickly precharge nodes within circuit 100, enabling fast response characteristics without sacrificing temperature stability.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A circuit for sensing the level of an input signal, comprising:
   a comparator, having first and second inputs;
   an input leg, having an input coupled to an input terminal receiving the input signal, and coupled to the first comparator input, comprising:
      an input capacitor;
      a first switch, connected between the input terminal and said input capacitor;
      a second switch, connected between the input capacitor and the first comparator input;
      a first bias circuit comprising a bipolar transistor, for defining a first diode voltage;
      a first charge-sharing capacitor;
      a third switch, connected between the emitter of the bipolar transistor in said first bias circuit and said first charge-sharing capacitor; and
      a fourth switch, connected between the first charge-sharing capacitor and said first comparator input; and
   a reference leg, coupled to the second comparator input, comprising:
      a second bias circuit, comprising a bipolar transistor, for defining a second diode voltage different from said first diode voltage;
      a second charge-sharing capacitor;
      a fifth switch, connected between the emitter of the bipolar transistor in said second bias circuit and said second charge-sharing capacitor; and
      a sixth switch, connected between the second charge-sharing capacitor and said second comparator input;
   wherein the difference between said first diode voltage and said second diode voltage increases with increasing temperature.

2. The circuit of claim 1, wherein said reference leg further comprises:
   a matching capacitor;
   a seventh switch connected between said matching capacitor and a reference voltage; and
   an eighth switch, connected between said matching capacitor and said second comparator input.

3. The circuit of claim 2, wherein said first through eighth switches comprise pass gates, each having a control terminal.

4. The circuit of claim 3, wherein the control terminals of pass gates of said second, fourth, sixth and eighth switches are connected together.

5. The circuit of claim 3, wherein the control terminals of pass gates of said third and fifth switches are connected together.

6. The circuit of claim 1, wherein said input leg further comprises:
a buffer capacitor;
a ninth switch, connected between said input terminal and said buffer capacitor; and
a tenth switch, connected between said input capacitor and a discharge voltage;
wherein said first switch is connected between said buffer capacitor and said input capacitor.

7. The circuit of claim 1, wherein said first bias circuit comprises:
a first plurality of bipolar transistors connected in an emitter follower series, with the emitter of a first one of said first plurality of bipolar transistors connected to said third switch; and
a first plurality of current sources, each associated with one of said first plurality of bipolar transistors;
and wherein said second bias circuit comprises:
a second plurality of bipolar transistors connected in an emitter follower series, with the emitter of a first one of said second plurality of bipolar transistors connected to said fifth switch; and
a second plurality of current sources, each associated with one of said second plurality of bipolar transistors.

8. The circuit of claim 7, wherein the numbers of bipolar transistors in said first and second pluralities of bipolar transistors are selected according to the rate at which the difference between said first diode voltage and said second diode voltage increases with increasing temperature.

9. The circuit of claim 1, further comprising:
a first reset transistor, having a conduction path coupled between said first charge-sharing capacitor and a bias voltage, and having a control terminal, said first reset transistor for precharging said first charge-sharing capacitor to a sufficient voltage that, responsive to said third switch being closed, the bipolar transistor in said first bias circuit conducts charge from said first charge-sharing capacitor; and
a second reset transistor, having a conduction path coupled between said second charge-sharing capacitor and a bias voltage, and having a control terminal, said second reset transistor for precharging said second charge-sharing capacitor to a sufficient voltage that, responsive to said fifth switch being closed, the bipolar transistor in said second bias circuit conducts charge from said second charge-sharing capacitor.

10. The circuit of claim 1, wherein each of said bipolar transistors in said first and second bias circuits comprises:
a collector formed in a semiconducting layer of a substrate;
a base region of opposite conductivity type from said semiconducting layer, formed in a well region at the surface of said substrate; and
an emitter region of opposite conductivity from said base region, formed at a surface of said well region.

11. The circuit of claim 10, wherein the emitter regions of the bipolar transistors in said first bias circuit are significantly larger than the emitter regions of the bipolar transistors in said second bias circuit.

12. A method of sensing the level of an input signal, comprising:
precharging a first charge-sharing capacitor to a voltage which is an integral multiple of a first diode voltage;
precharging a second charge-sharing capacitor to a voltage which is an integral multiple of a second diode voltage, said second diode voltage having a different temperature coefficient than said first diode voltage such that the difference between said first and second diode voltages increases with increasing temperature;
sampling the input voltage by connecting an input capacitor to receive the input signal;
connecting the input capacitor to the first charge-sharing capacitor so that the charge on the input capacitor and the first charge-sharing capacitor is shared therebetween; and
coupling the first charge-sharing capacitor and the second charge-sharing capacitor to first and second inputs of a comparator, respectively, to sense the differential voltage thereat.

13. The method of claim 12, further comprising:
connecting a matching capacitor to a reference voltage; and
prior to said coupling step, connecting the matching capacitor to the second charge-sharing capacitor so that the charge on the matching capacitor and the second charge-sharing capacitor is shared therebetween.

14. The method of claim 11, wherein the integral multiple of said first diode voltage is determined by a first plurality of bipolar transistors interconnected in emitter follower fashion;
and wherein the integral multiple of said second diode voltage is determined by a second plurality of bipolar transistors interconnected in emitter follower fashion.

15. The method of claim 14, wherein the numbers of transistors in said first and second pluralities of bipolar transistors are selected according to the rate of change of the difference between said first and second diode voltages with temperature.

16. The method of claim 14, further comprising:
during said step of precharging said first charge-sharing capacitor, decreasing the impedance of one of said first plurality of bipolar transistors.

17. The method of claim 16, further comprising:
prior to said step of precharging said second charge-sharing capacitor, decreasing the impedance of one of said second plurality of bipolar transistors.

18. The method of claim 11, wherein said sampling step comprises:
connecting a buffer capacitor to an input terminal to receive the input signal;
disconnecting the buffer capacitor from the input terminal; and
connecting the buffer capacitor to the input capacitor, so that the charge on said buffer capacitor is shared with the input capacitor.

* * * * *